(12) United States Patent
Lee et al.

(10) Patent No.: US 7,701,503 B2
(45) Date of Patent: Apr. 20, 2010

(54) METHOD FOR CONTROLLING LIGHT SOURCE AND OPTICAL INPUT DEVICE USING THE SAME

(75) Inventors: Bang-Won Lee, Yongin-si (KR); Young-Ho Shin, Yongin-si (KR)

(73) Assignee: Atlab Inc. (KR)

( * ) Notice: Subject to any disclaimer, the term of this patent is extended or adjusted under 35 U.S.C. 154(b) by 1437 days.

(21) Appl. No.: 11/042,697

(22) Filed: Jan. 25, 2005

(65) Prior Publication Data
US 2005/0161582 A1    Jul. 28, 2005

(30) Foreign Application Priority Data
Jan. 26, 2004 (KR) ............. 10-2004-0004840

(51) Int. Cl.
*G01J 1/32* (2006.01)
*H01J 40/14* (2006.01)
(52) U.S. Cl. .............. 348/362; 345/166; 345/163; 345/158; 250/208.1; 250/214; 250/205
(58) Field of Classification Search .......... 348/252, 348/370, 371, 372, 297; 396/180; 345/163–166
See application file for complete search history.

(56) References Cited
U.S. PATENT DOCUMENTS

| 5,485,534 A * | 1/1996 | Takemoto et al. ........... 382/263 |
| 6,674,475 B1 * | 1/2004 | Anderson .................. 348/367 |
| 6,795,056 B2 * | 9/2004 | Norskog et al. ............ 345/158 |
| 6,797,937 B2 * | 9/2004 | Norskog et al. ............ 250/221 |
| 6,995,748 B2 * | 2/2006 | Gordon et al. ............. 345/166 |
| 7,064,311 B2 * | 6/2006 | Jung et al. ................ 250/205 |
| 7,295,186 B2 * | 11/2007 | Brosnan .................. 345/166 |

| 2002/0006282 A1 * | 1/2002 | Ushiro et al. .............. 396/429 |
| 2002/0145757 A1 * | 10/2002 | Fedorovskaya et al. ...... 358/3.1 |

(Continued)

FOREIGN PATENT DOCUMENTS
JP    07-298130    11/1995

OTHER PUBLICATIONS

Office Action of China, Regarding corresponding patent application No. 200510002927X, Date: Jul. 14, 2006 All references in the search report are listed above.

*Primary Examiner*—Lin Ye
*Assistant Examiner*—Temitope Adeyiga
(74) *Attorney, Agent, or Firm*—Cantor Colburn LLP

(57) ABSTRACT

Disclosed is a method for controlling a light source and optical input device using the same. The light source controlling method includes setting a shutter ON time of an image sensor using a statistical value of an image obtained through the image sensor, and setting a light source ON time in accordance with the shutter ON time and turning on/off the light source and the shutter in response to the set light source ON time and the set shutter ON time.

Thus, undesired consumption of electric power of the light source is prevented to increase energy efficiency by actively setting an ON/OFF period of the light source consuming the maximum electric current in the optical input device according to a shutter ON/OFF period. Further, availability of the light source and its electric current is enhanced by controlling the light source for the shutter OFF period and by allowing the light source to be used as a source for the data transmission.

19 Claims, 12 Drawing Sheets

U.S. PATENT DOCUMENTS

| | | | |
|---|---|---|---|
| 2003/0020688 A1* | 1/2003 | Norskog et al. | 345/158 |
| 2003/0026455 A1* | 2/2003 | Watanabe et al. | 382/104 |
| 2003/0086010 A1* | 5/2003 | Luo et al. | 348/297 |
| 2003/0099044 A1* | 5/2003 | Fujii | 359/698 |
| 2004/0129861 A1* | 7/2004 | Jung et al. | 250/208.1 |

* cited by examiner

MOVEMENT SENSING (SUCCESS)    MOVEMENT SENSING (FAILURE)

METHOD FOR CONTROLLING LIGHT SOURCE AND OPTICAL INPUT DEVICE USING THE SAME

CROSS-REFERENCE TO RELATED APPLICATION

This application claims the benefit of Korean Patent Application No. 2004-4840, filed on Jan. 26, 2004, the disclosure of which is hereby incorporated herein by reference in its entirety.

BACKGROUND OF THE INVENTION

1. Field of the Invention

The present invention relates to an optical input device and, more particularly, to an optical input device, in which an ON/OFF time of a light source is actively set according to an ON/OFF time of a shutter in the case of collecting light from the light source to obtain an image to detect movement.

2. Description of the Related Art

A human interface device (HID) generally refers to all the devices which support a human to conveniently process an interface with a computer or its peripherals. The HID may be sorted into a keyboard, a mouse, a wireless remote controller, and keypad for a mobile phone, a computer, a digital camera, television, and so forth.

In particular, the invention is directed to an optical input device among the HIDs, which collects light from a light source, obtains an image, calculates movement, and outputs the calculated result.

An optical mouse stands for the optical input device, and is designed so that a light source illuminates light on a subject (workable surface) with which the mouse comes into contact, and then an image sensor reads movement of the reflected light to move a cursor.

The optical mouse of this type has a variety of kinds. The first is a wired optical mouse using power of the computer and PS2/USB (Universal Serial Bus) for transmission of data.

The second is an RF (Radio Frequency) optical mouse using its built-in battery as a power source and an additional RF transmitter for data transmission.

The third is an IR (Infrared) optical mouse using its built-in battery as a power source and including an additional data transmission light source and a transmission module to transmit the data of the optical mouse on the basis of an IR mechanism.

In this manner, the optical mouse applied in the various types is designed, as shown in FIG. 1, so that light 7 emitted from a light source 8 is reflected from a worktable surface 2, and the reflected light 6 passes through a lens 5 to be inputted into an image sensor 3.

The optical mouse 1 obtains an image of the worktable surface 2 using a quantity of light 6 collected in the image sensor 3, and calculates the movement of the optical mouse by comparing the obtained image with an image formed in the previous sample period.

In this case, when the movement is sensed, the optical mouse unconditionally keeps the light source 8 in an on state as in FIG. 2. However, when the movement is not sensed, the optical mouse causes the light source 8 to be turned on/off at constant intervals.

And the optical mouse controls a time when the image sensor is shuttered on as in FIGS. 3A and 3B according to brightness of the worktable surface in order to exactly read an image of the worktable surface. The optical mouse causes a quantity of the light incident on the image sensor 3 to have a constant value at all times by decreasing the time when the image sensor 3 is shuttered on in the bright workable surface and by increasing the time when the image sensor 3 is shuttered on in the dark workable surface.

In FIGS. 3A and 3B, a shutter on period refers to a period where the image sensor 3 reads the image of the worktable surface 2 through the quantity of the incident light, while a shutter OFF period refers to a period where the image sensor 3 does not read the image of the worktable surface 2.

In this manner, the optical mouse according to the prior art turns on the light source without any condition when its movement is sensed.

Therefore, the optical mouse according to the prior art is operated by on operation of the light source even in the period where it is unnecessary to be operated by on operation of the light source, such as the shutter OFF period where the image sensor does not read the image of the worktable surface, thus resulting in undesired waste of electric power and reduction of energy efficiency.

For this reason, when the optical mouse is either the wired optical mouse connected to a device such as a notebook computer sensitive to consumption of the electric power or the IR or RF optical mouse using its built-in battery as a power source, undesired consumption of the electric power is generated, so that there is a trouble of frequently substituting the battery.

SUMMARY OF THE INVENTION

It is, therefore, an objective of the present invention to provide a method for controlling a light source and optical input device using the same, capable of increasing energy efficiency by actively setting an ON time of the light source consuming a great electric current according to a shutter ON time.

It is another objective of the present invention to provide a method for controlling a light source and optical input device using the same, capable of increasing availability of the light source and its electric current by allowing data to be transmitted though light from the light source for a shutter OFF period.

In order to accomplish the objectives, a method for controlling a light source in accordance with one aspect of the invention includes: setting a shutter ON time of an image sensor using a statistical value of an image obtained through the image sensor; and setting a light source ON time in accordance with the shutter ON time and turning on/off the light source and the shutter in response to the set light source ON time and the set shutter ON time.

Meanwhile, in order to accomplish the objectives, a method for controlling a light source in accordance with another aspect of the invention includes: setting a shutter ON time of an image sensor using a statistical value of an image obtained through the image sensor; setting a light source ON time in accordance with the shutter ON time and turning on/off the light source and the shutter in response to the set light source ON time and the set shutter ON time; and when the image sensor becomes a shutter OFF state and data to be transmitted are present, controlling the light source to transmit the data.

In order to accomplish the objectives, an optical input device according to one aspect of the invention includes: an image sensor for collecting incident light when becoming a shutter ON state; a movement calculator for calculating and outputting a value of movement using a quantity of the light collected on the image sensor; a shutter controller for setting a shutter ON time according to brightness of a subject and controlling the image sensor according to the set shutter ON time; and a light source controller for setting a light source ON time to correspond to the shutter ON time of the shutter controller, controlling the light source according to the set light source ON time, and when the image sensor becomes a shutter OFF state and the movement value is received from the movement calculator, controlling the light source to transmit the movement value.

In order to accomplish the objectives, an optical input device according to another aspect of the invention includes: an image sensor for collecting incident light when becoming a shutter ON state; a movement calculator for calculating and outputting a value of movement using a quantity of the light collected on the image sensor; a shutter controller for setting a shutter ON time according to brightness of a subject and controlling the image sensor according to the set shutter ON time; a light source controller for setting a light source ON time to correspond to the shutter ON time of the shutter controller and controlling the light source according to the set light source ON time; a transmission light source controller for transmitting the movement value when the image sensor becomes a shutter OFF state and the movement value is received from the movement calculator; and a transmission light source for performing ON/OFF operation in response to a transmission light source control signal transmitted from the transmission light source controller.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Hereinafter, a method for controlling a light source and optical input device using the same according to the present invention will be described with reference to the accompanying drawings.

Figure 1:
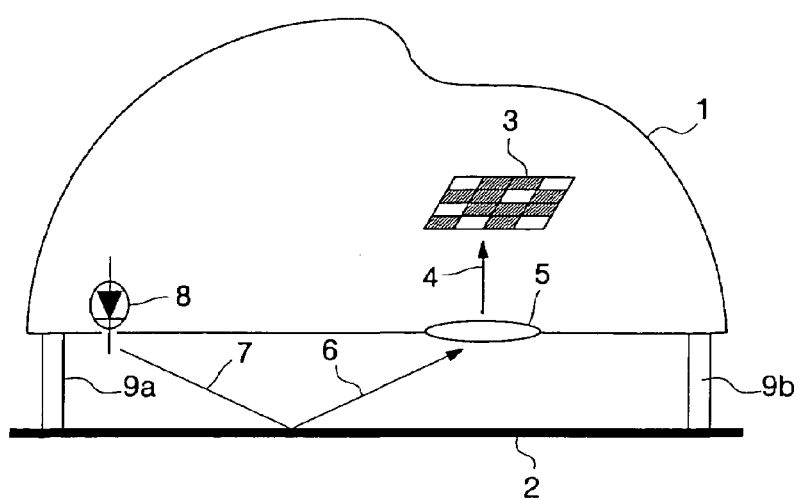
FIG. 1 shows a configuration of an optical mouse according to the prior art.
Figure 2:
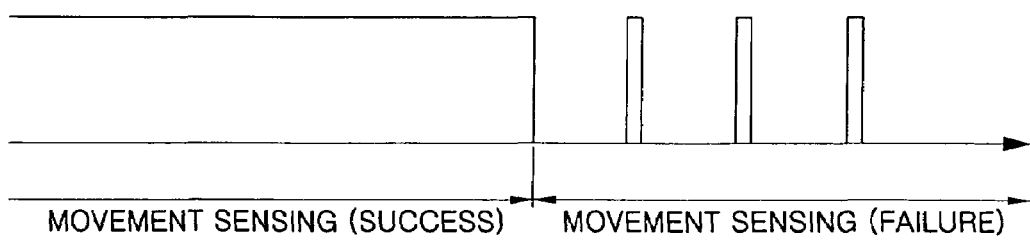
FIG. 2 is a view for explaining a light source ON time of an optical mouse according to the prior art.
Figure 3A:
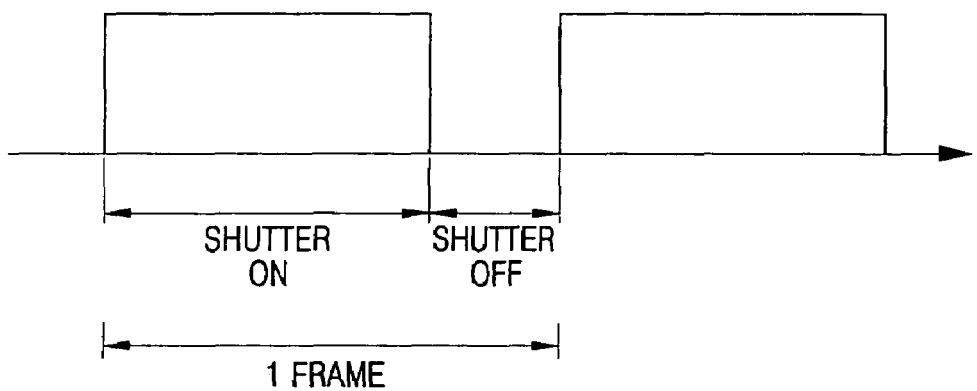
FIG. 3A is a view for explaining a shutter ON time when an optical mouse according to the prior art exists in a dark area.
Figure 3B:
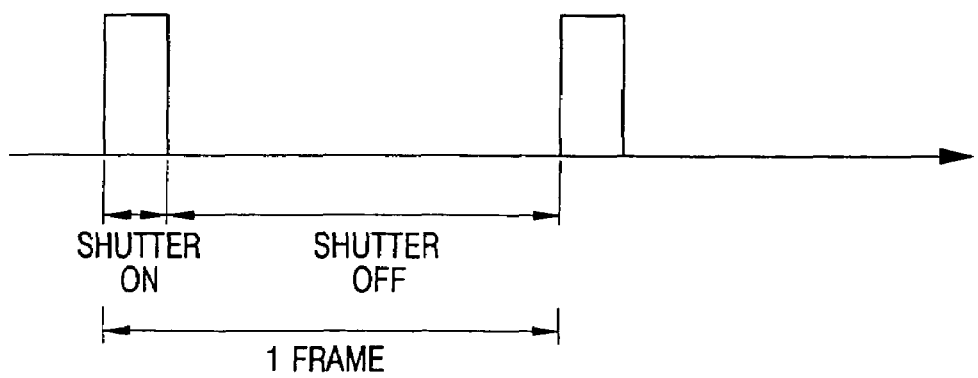
FIG. 3B is a view for explaining a shutter ON time when an optical mouse according to the prior art exists in a bright area.
Figure 4:
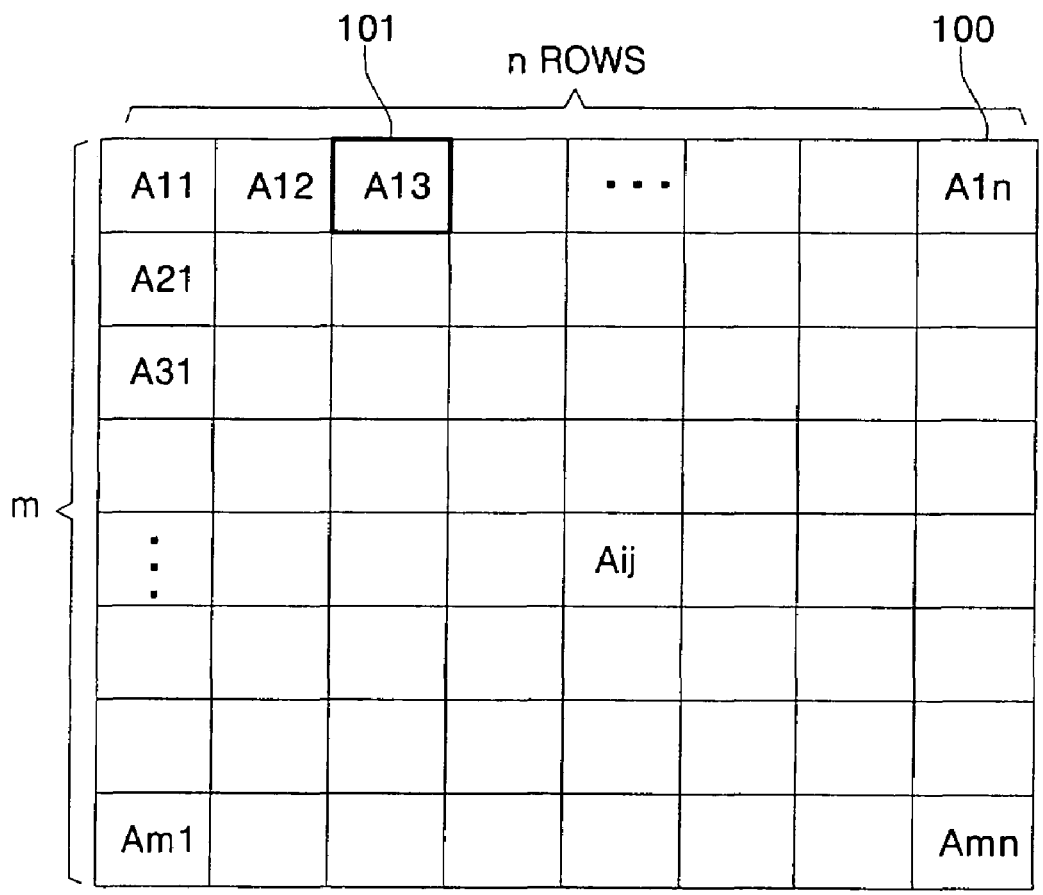
FIG. 4 shows an image sensor of the present invention.

FIG. 4 shows an image sensor of the present invention.

As shown in FIG. 4, the image sensor of the present invention is composed of a pixel array 100 having an n number of rows and an m number of columns. Each pixel 101 of the pixel array 100 accumulates light incident thereon for a shutter on period, and generates and outputs an electrical signal corresponding to a quantity of the accumulated light when the shutter ON period is changed into a shutter OFF period.

Herein, the respective pixels 101 will be denoted by Aij. For example, the pixel 101 located on the $1^{st}$ row and the $3^{rd}$ column in the pixel array 100 is denoted by A13.

Figure 5:
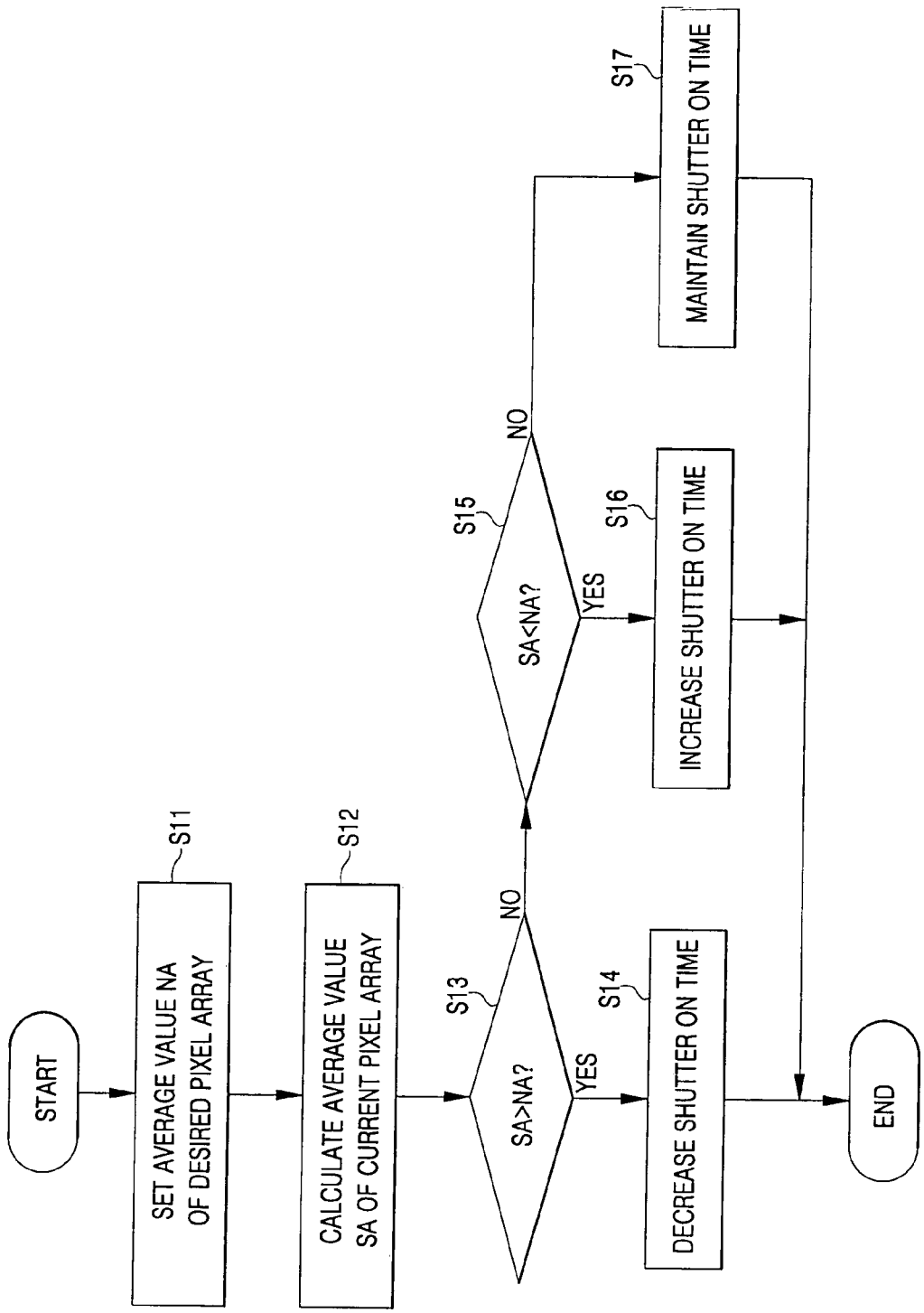
FIG. 5 is a flow chart for explaining a method for controlling a shutter time of an image sensor in accordance with one embodiment of the present invention.

FIG. 5 is a flow chart for explaining a method for controlling a shutter time of an image sensor in accordance with one embodiment of the present invention.

To begin with, when the method of controlling the shutter time of the present invention makes a start, an optical mouse performs an initialization work for setting an average value (NA) of the pixel array in which the optical mouse requires for normal operation (S11).

After the initialization work is completed, the image sensor becomes the shutter OFF state, receives an m×n number of electrical signals which are outputted from the respective pixels Aij of the pixel array, and calculates an average value SA of the received m×n electrical signals (S12).

And it is checked whether the calculated average value SA is greater than the average value NA set on initialization (S13). As a result of checking in step S13, when the calculated average value SA is greater than the set average value NA, the image sensor determines that a current shutter ON time is excessive, thus decreasing the shutter ON time (S14). On the contrary, as a result of checking in step S13, when the calculated average value SA is smaller than the set average value NA (S15), the image sensor determines that the current shutter ON time is insufficient, thus increasing the shutter ON time (S16). When the calculated average value SA is equal to the set average value NA, the image sensor determines the current shutter ON time to be proper, thus maintaining the shutter ON time (S17).

In the above-mentioned description, the shutter ON time of the image sensor has been calculated using the average value of the electrical signals outputted from the respective pixels of the pixel array 100.

However, if necessary, the shutter ON time of the image sensor may be calculated using the electrical signals outputted either from one pixel located at a specific position of the pixel array 100 or from at least one pixel selected at every specific position rather than all the positions.

Figure 6:
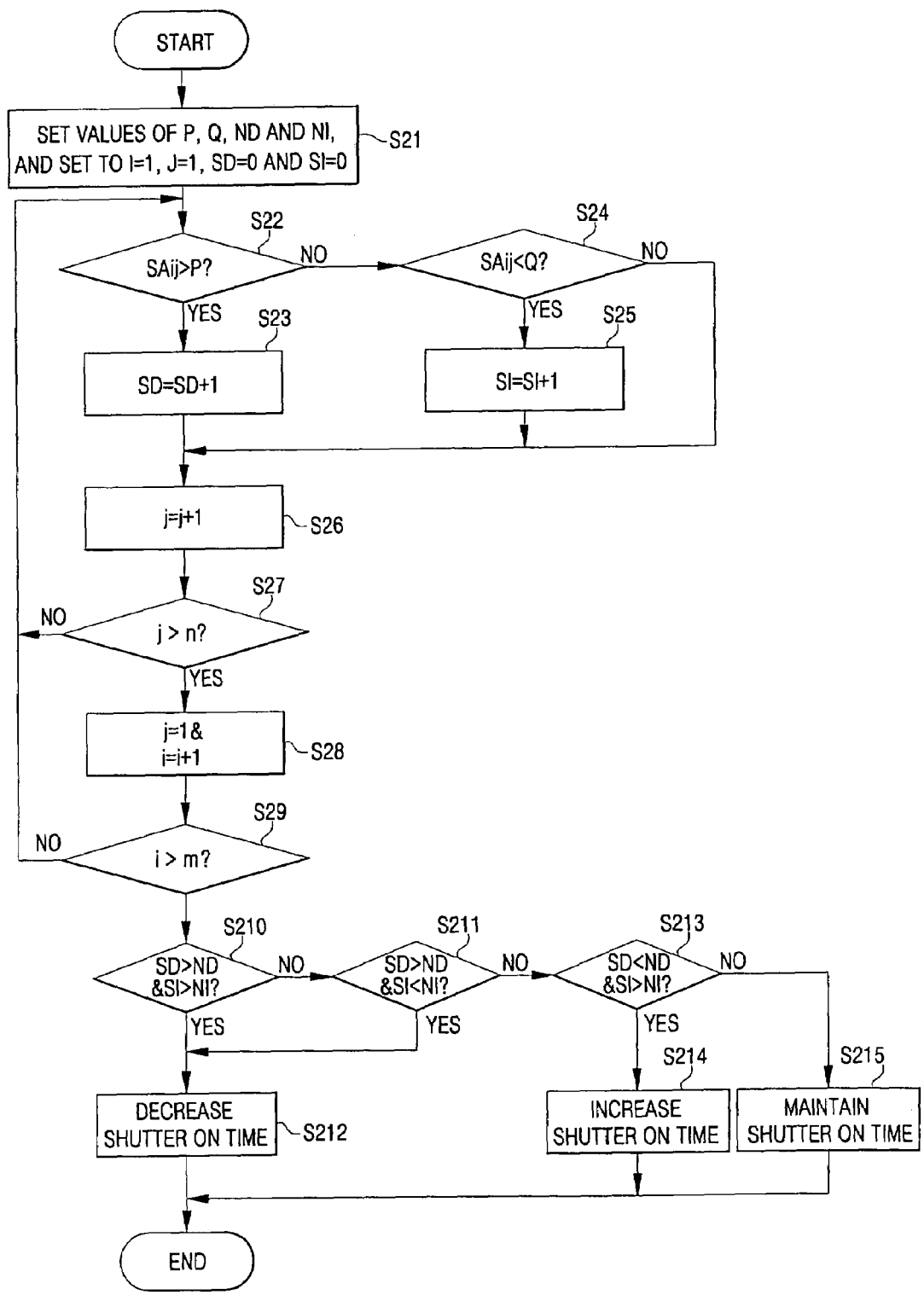
FIG. 6 is a flow chart for explaining a method for controlling a shutter time of an image sensor in accordance with another embodiment of the present invention.

FIG. 6 is a flow chart for explaining a method for controlling a shutter time of an image sensor in accordance with another embodiment of the present invention.

Above all, when the method for controlling the shutter time of the present invention makes a start, both a reference value P for a supersaturated quantity of light that any pixel indicates supersaturation of the accumulated light and a reference value Q for a subsaturated quantity of light that any pixel indicates subsaturation of the accumulated light are set. The numbers of supersaturated and subsaturated pixels ND and N1 in which the optical mouse requires for normal operation are set.

An initializing work is performed, in which the numbers of acquired supersatured and subsaturated pixels SD and S1 are set to zero(0) respectively, and row and column numbers of pixels i and j are set to one(1), respectively (S21).

When the initialization is completed, it is checked whether values SAij of the electrical signals of the pixels Aij are greater than the supersaturated light quantity reference value P (S22). When the values SAij of the electrical signals of the pixels Aij are greater than the supersaturated light quantity reference value P, the number of acquired supersaturated pixels SD is increased by 1 (S23), and then it proceeds to step S26.

To the contrary, when the values SAij of the electrical signals of the pixels Aij are smaller than the supersaturated light quantity reference value P, it is checked whether the values SAij of the electrical signals of the pixels Aij are smaller than the subsaturated light quantity reference value Q, or not (S24). When the values SAij of the electrical signals of the pixels Aij are smaller than the subsaturated light quantity reference value Q, the number of acquired subsaturated pixels S1 is increased by 1 (S25), and then it proceeds to step S26. Otherwise, it proceeds to step S26 as it stands, i.e. without any change.

It is checked whether, after increasing the column number j by 1 (S26), the increased column number j is greater than the column number n provided by the pixel array 100 or not (S27). When the increased column number j is greater than the column number n, the column number j is set to 1 and the row number i is increased by 1 (S28), and then it is checked whether the increased row number i is greater than the row number m provided by the pixel array 100 (S29).

As a result of checking in step S29, the increased row number i is not greater than the row number m, it is determined that the pixels Aij which do not yet read the electrical signal values SAij are present. Thus, in order to read the electrical signal values SAij of the pixels Aij having the increased row or column number i or j, it proceeds to step S21.

As a result of checking in step S29, when the increased row number i is greater than the row number m, it is determined that the electrical signal values SAij of all pixels of the pixel array 100 are read. When the numbers of acquired supersaturated and subsaturated pixels SD and SI are more than the numbers of set supersaturated and subsaturated pixels ND and NI (S210), or when the number of acquired supersaturated pixels SD is more than the number of set supersaturated pixels ND and the number of acquired subsaturated pixels SI is less than the number of set subsaturated pixels NI (S211), the current shutter ON time is decreased (S212).

By contrast, when the number of acquired supersaturated pixels SD is less than the number of set supersaturated pixels ND and the number of acquired subsaturated pixels SI is more than the number of set subsaturated pixels NI (S213), the current shutter ON time is increased (S214). Otherwise the current shutter ON time is maintained (S215).

Figure 7:
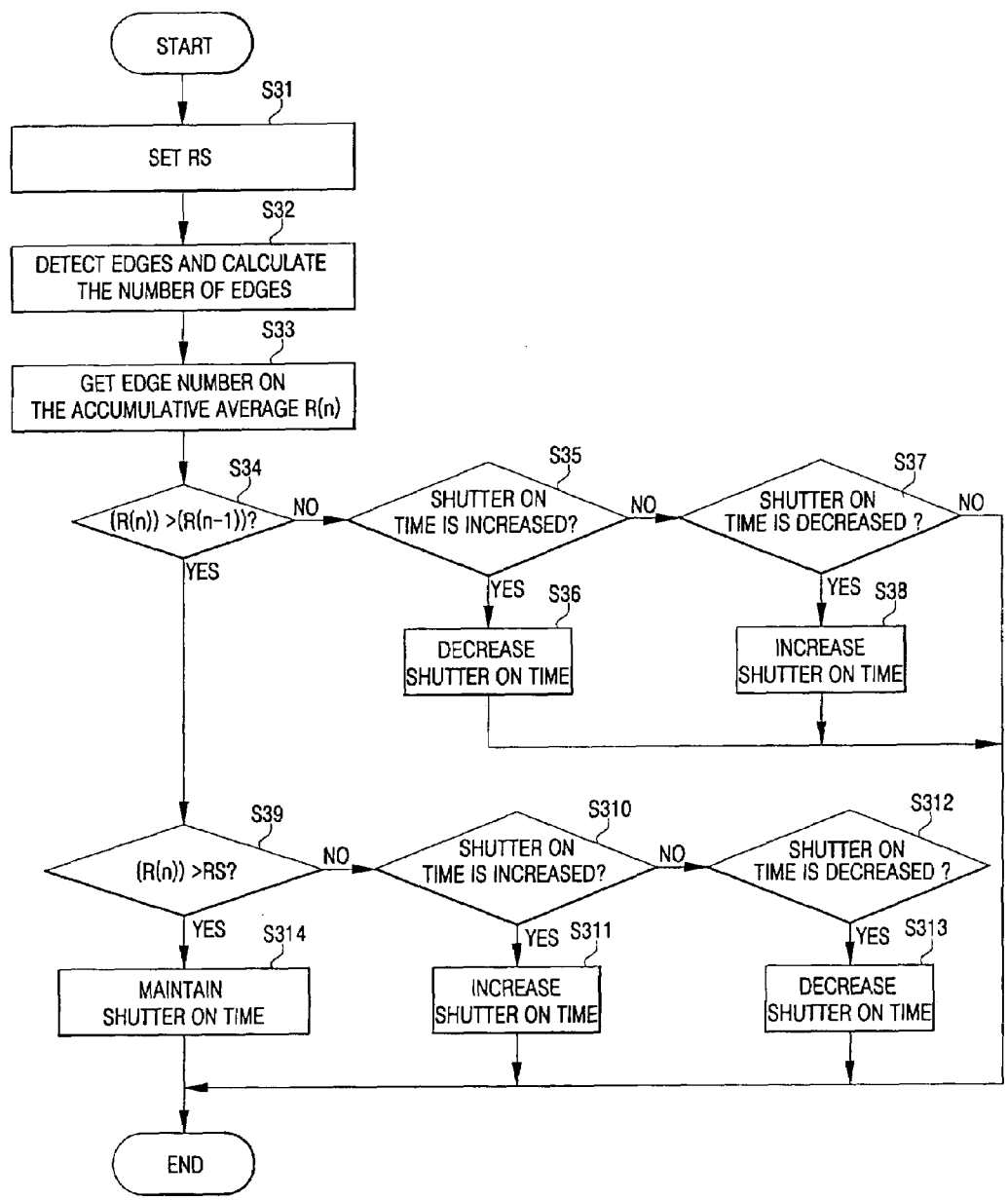
FIG. 7 is a flow chart for explaining a method for controlling a shutter time of an image sensor in accordance with yet another embodiment of the present invention.

FIG. 7 is a flow chart for explaining a method for controlling a shutter time of an image sensor in accordance with yet another embodiment of the present invention.

The method for controlling the shutter time of the image sensor shown in FIG. 7 is to apply a principle where the number of edges extracted from an image is decreased in the case that a shutter ON time is insufficient or too long.

First, when the shutter time controlling method of the present invention makes a start, an initialization work is performed, which set the number of edges RS in which the optical mouse requires for normal operation (S31).

When the initialization work is completed, only edges of the image acquired during a current sampling period are extracted using an edge detection technique, and the number of edges of the image is calculated (S32).

An accumulative average R(n) of the number of edges calculated through the step S32 and the number of edges of plural images acquired during a previous sampling period is calculated (S33).

The current accumulative average R(n) calculated through the step S33 is compared with a previous accumulative average R(n−1) found during a previous sampling period in order to check which of the accumulative averages is greater (S34).

As a result of the comparison in step S34, when the current accumulative average R(n) is smaller than the previous accumulative average R(n−1), it is determined that the shutter ON time is excessively adjusted. Hence, in the case that the shutter ON time has been previously increased (S35), the shutter ON time is decreased (S36). However, in the case that the shutter ON time has been previously decreased (S37), the shutter ON time is increased (S38).

By contrast, as a result of the comparison in step S34, when the current accumulative average R(n) is greater than the previous accumulative average R(n−1), the current accumulative average R(n) is again compared with the number of edges RS set on initialization in order to check which of them is greater (S39). When the current accumulative average R(n) is smaller than the number of edges RS set on initialization, it is determined that the shutter ON time is still adjusted insufficiently. Hence, in the case that the shutter ON time has been previously increased (S310), the shutter ON time continues to be increased (S311). However, in the case that the shutter ON time has been previously decreased (S312), the shutter ON time continues to be decreased (S313).

However, when the current accumulative average R(n) is greater than the number of edges RS set on initialization, the current shutter ON time is maintained (S314).

Figure 8:
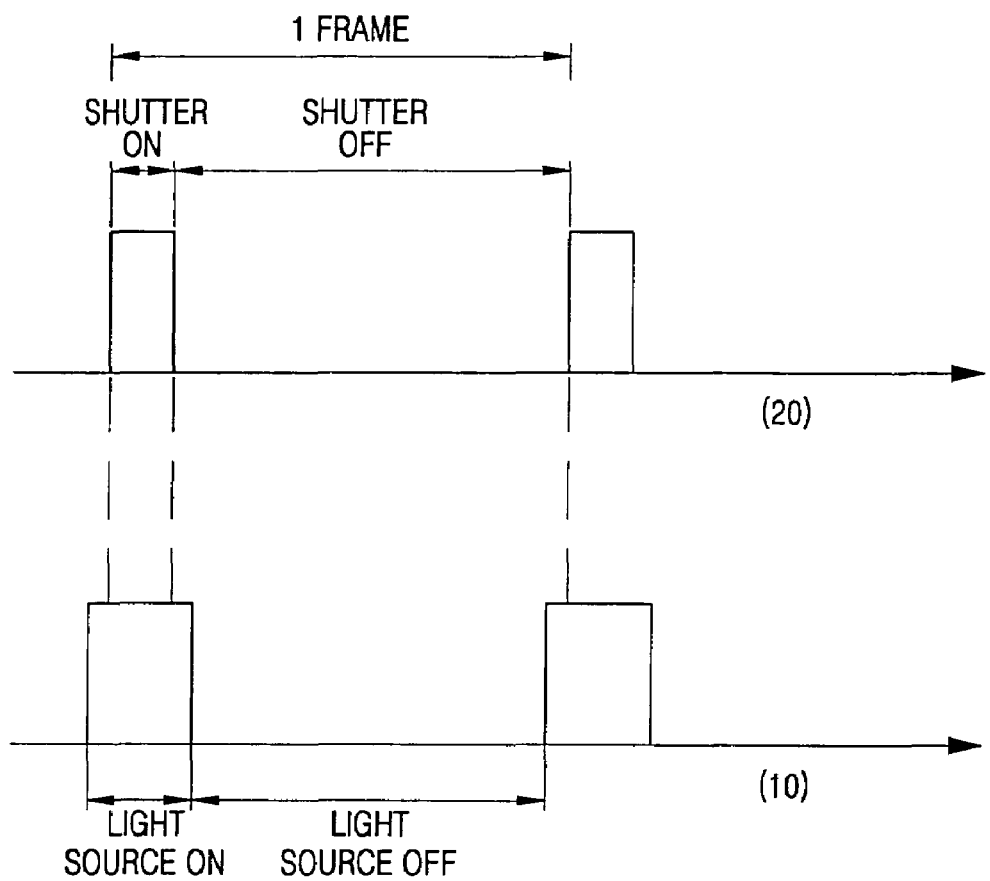
FIG. 8 is a view for explaining a method for controlling a light source ON time in accordance with one embodiment of the present invention.

FIG. 8 is a view for explaining a method for controlling a light source ON time in accordance with one embodiment of the present invention.

As shown in FIG. 8, the light source ON time of the present invention is actively set according to a shutter ON time. Thus, the light source is turned on in a shutter ON period and turned off in a shutter OFF period.

A light source ON period represented by a reference number (10) of FIG. 8 is always adapted to be longer relative to the shutter ON period represented by a reference number (20) of FIG. 8.

This is because, in view of an operating characteristic of the optical mouse, the light source is always in the ON state when the image sensor becomes the shutter ON state, in order for the image sensor to read an exact quantity of light.

At this time, the shutter ON time is controlled by the methods for controlling the shutter time of the image sensor described with reference to FIGS. 5, 6 and 7.

Figure 9:
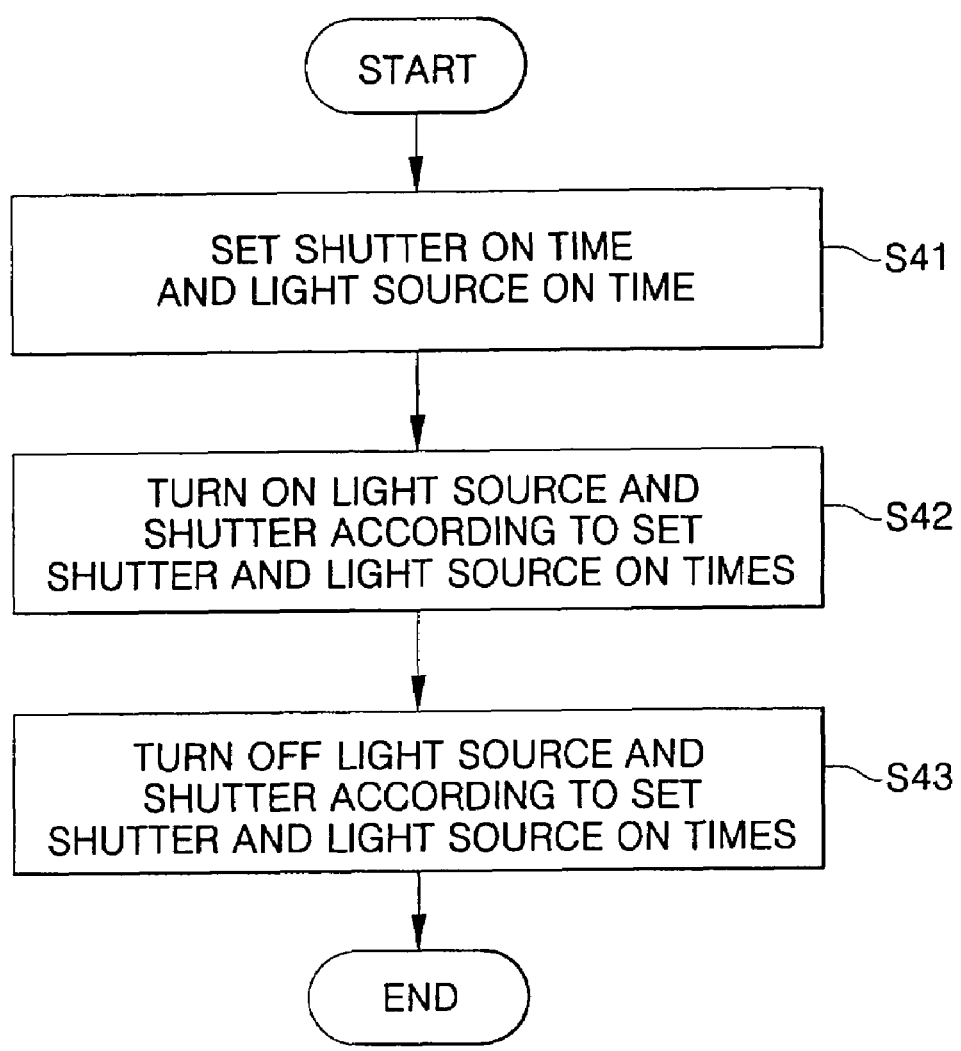
FIG. 9 is a flow chart for explaining a method for controlling a light source in accordance with one embodiment of the present invention.

FIG. 9 is a flow chart for explaining a method for controlling a light source in accordance with one embodiment of the present invention.

Above all, the optical mouse checks brightness of a worktable surface, and sets a shutter ON time of the image sensor so that a quantity of light incident on the image sensor can maintain a constant value, as well as a light source ON time by causing the shutter ON time to overlap the light source ON time and simultaneously by causing the light source ON time to be longer than the shutter ON time (S41).

When the light source ON time arrives according to the set shutter ON time and light source ON time, the light source is turned on. And when the shutter ON time arrives according to the shutter ON time, the image sensor becomes a shutter ON state, reads a quantity of light incident through a lens, and obtains an image of the worktable surface using the read quantity of light (S42).

When a shutter ON period is terminated to thus reach a shutter OFF time according to the set shutter ON time and light source ON time, the image sensor becomes a shutter OFF state. And when a light source ON period is terminated to reach a light source OFF time, the light source is turned off (S43).

In this manner, the light source ON time of the present invention is actively set in correspondence to the shutter ON time which is set if necessary according to the brightness of the subject (i.e., the worktable surface).

Therefore, the present invention prevents undesired consumption of electric power by allowing the light source to be turned on for the shutter ON time. This effect is further improved when the optical mouse operates on a bright worktable surface to have the shutter OFF period increased.

Figure 10:
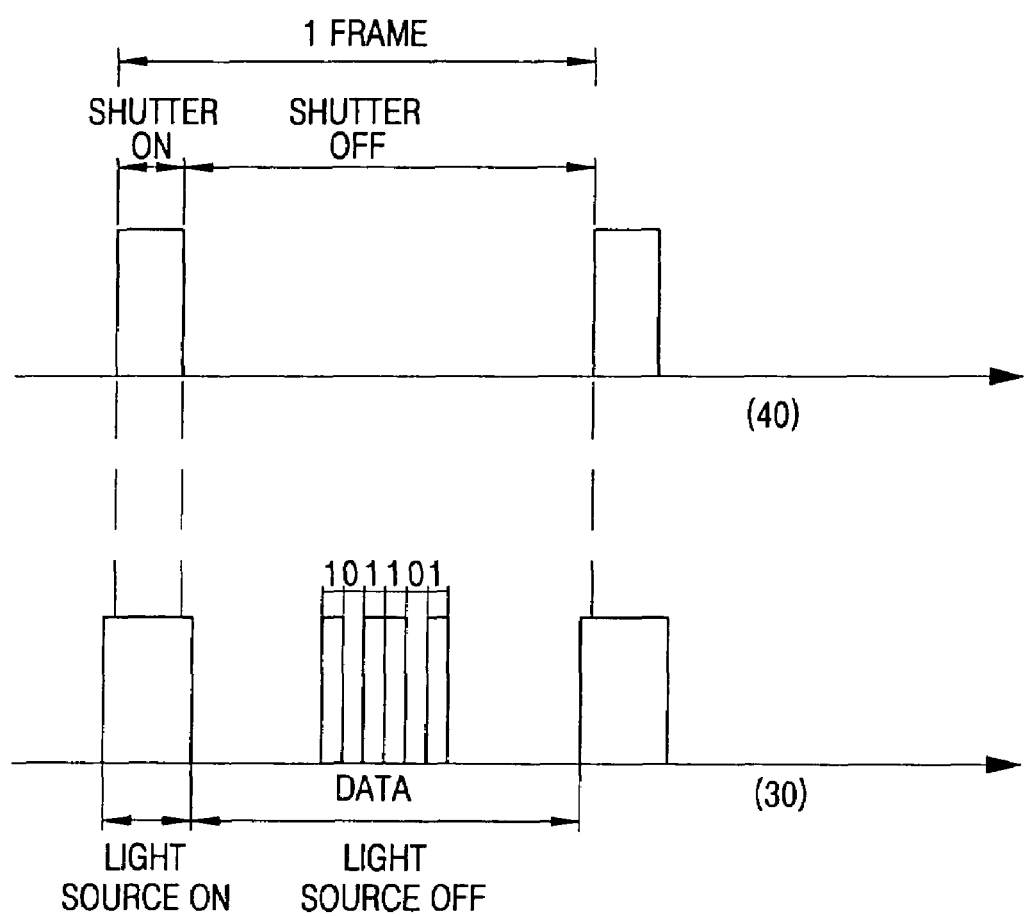
FIG. 10 is a view for explaining a method of transmitting data using a light source in accordance with another embodiment of the present invention.

FIG. 10 is a view for explaining a method of transmitting data using a light source in accordance with another embodiment of the present invention.

The present invention shown in FIG. 10 is for transmitting data by actively setting the light source ON time in correspondence to the shutter ON time and simultaneously using the light source for the shutter OFF period, as in FIG. 5.

Generally, light from the light source of the optical mouse is illuminated on a worktable surface at a slant angle, thus generating a shadow of a protrusion of the worktable surface. An image sensor determines a value of movement of the optical mouse using the shadow. However, the light illuminated on the worktable surface is slantly directed to the worktable surface, so that the light is subjected to total reflection. Hence, most of the light is dissipated without being incident on the image sensor.

For this reason, the present invention shown in FIG. 10 turns on the light source to allow the image sensor to read a quantity of incident light in the shutter ON period and makes use of the total-reflected light as a source for transmitting the data in the shutter OFF period, thereby transmitting various data generated from the optical mouse to the outside.

Subsequently, referring to a reference number (30) of FIG. 10, it can be seen that the method for transmitting data using the light source in accordance with the present invention transmits the data of the optical mouse having a value of 101101 to the outside using the way that the light source is turned on to transmit "H" data and turned off to transmit "L" data, in the shutter OFF period.

Figure 11:
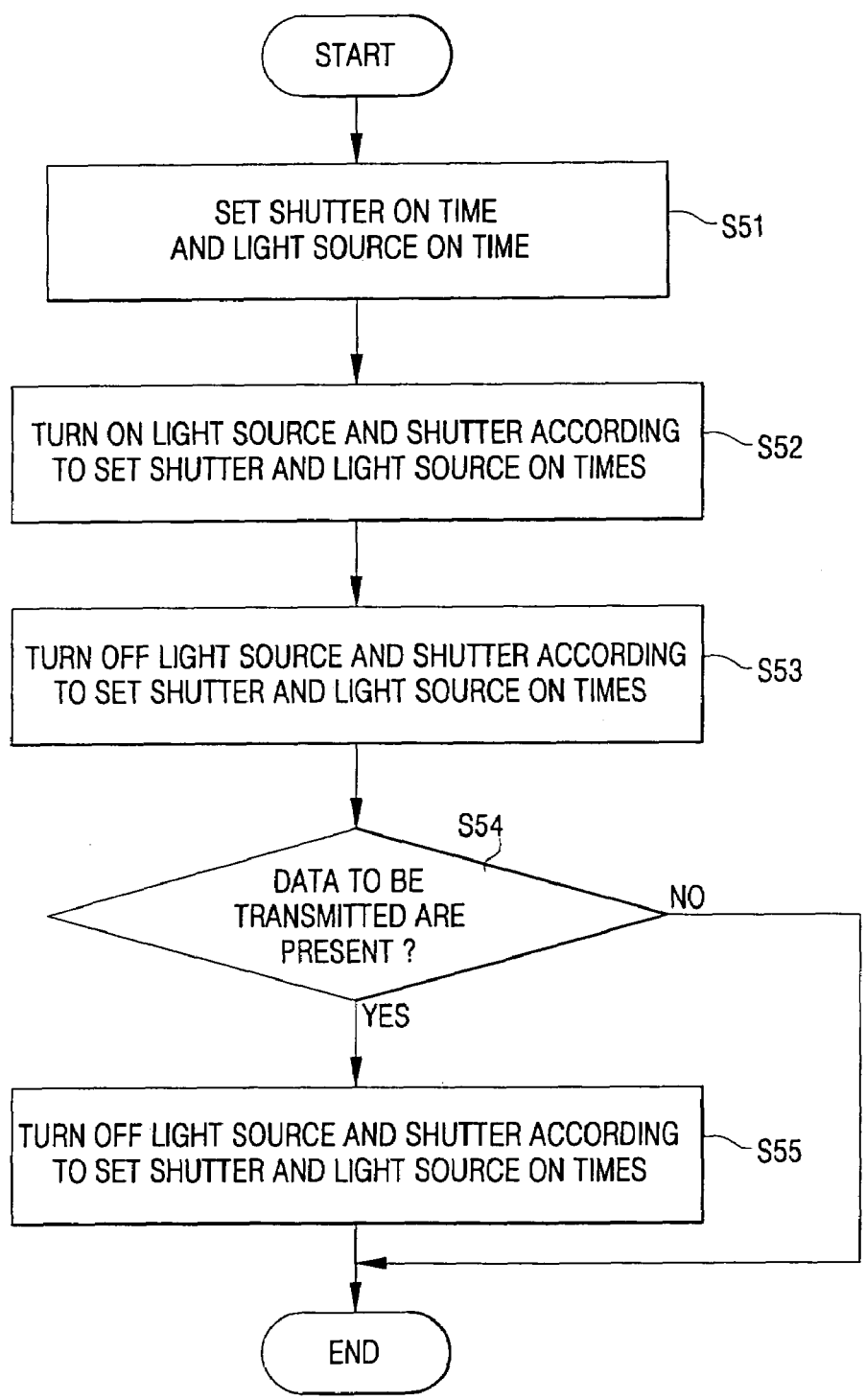
FIG. 11 is a flow chart for explaining a method for controlling a light source in accordance with another embodiment of the present invention.

FIG. 11 is a flow chart for explaining a method for controlling a light source in accordance with another embodiment of the present invention.

Above all, the optical mouse checks brightness of a worktable surface, and sets a shutter ON time of the image sensor so that a quantity of light incident on the image sensor can maintain an average value, as well as a light source ON time by causing the shutter ON time to overlap the light source ON time and simultaneously by causing the light source ON time to be longer than the shutter ON time (S51).

When the light source ON time arrives according to the set shutter ON time and light source ON time, the light source is turned on. And when the shutter ON time arrives according to the shutter ON time, the image sensor becomes a shutter ON state, reads a quantity of light incident through a lens, and obtains an image of the worktable surface using the read quantity of light (S52).

When a shutter ON period is terminated to thus reach a shutter OFF time according to the set shutter ON time and light source ON time, the image sensor becomes a shutter OFF state. And when a light source ON period is terminated to reach a light source OFF time, the light source is turned off (S53).

When a shutter OFF period comes, it is determined whether data to be transmitted are present or not (S54).

As a result of the determination in step S54, when the data to be transmitted are present, the data in question are transmitted to the outside using the way that the light source is turned on to transmit "H" data and turned off to transmit "L" data (S55).

Figure 12:
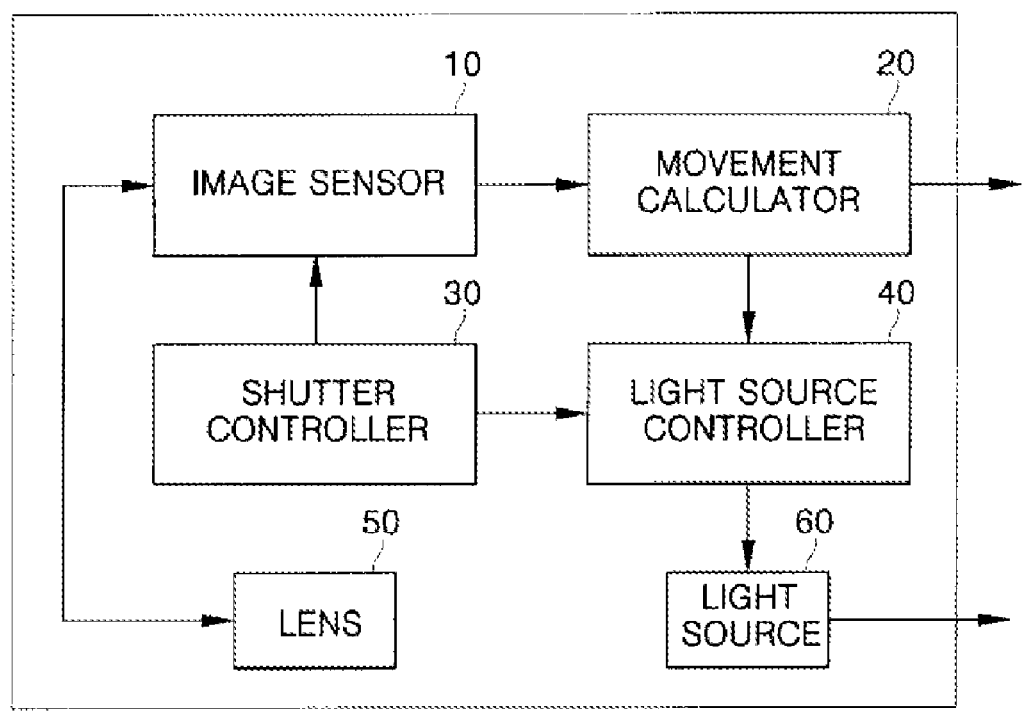
FIG. 12 shows a configuration of an optical mouse according to one embodiment of the present invention.

FIG. 12 shows a configuration of an optical mouse according to one embodiment of the present invention.

Referring to FIG. 12, the optical mouse includes an image sensor 10, a movement calculator 20, a shutter controller 30, a light source controller 40, a lens 50 and a light source 60.

The image sensor 10 becomes a shutter ON state and reads light which is reflected on a worktable surface to be incident through the lens 50 when receiving a shutter ON control signal in response to the shutter ON control signal transmitted from the shutter controller 30, and becomes a shutter OFF state and does not read the light which is reflected on the worktable surface to be incident through the lens 50 when receiving a shutter OFF control signal.

The movement calculator 20 calculates a quantity of light collected on the image sensor 10 to obtain an image of the worktable surface with which the optical mouse comes into contact, and set the obtained image of the worktable surface as a sample frame and an image of the worktable surface obtained just before the obtained image as a reference frame.

The movement calculator 20 sets a reference area in one whole frame selected and stored as the reference frame, and calculates correlation between the currently inputted sample frame and the reference area of the reference frame until it begins at a left upper corner of the current frame to reach a right lower corner in a zigzag scanning pattern in the unit of one pixel.

A location of the sample frame having the highest correlation with the reference frame among values of the calculated correlation is found to obtain a movement value of the optical mouse. The obtained movement value is outputted outside.

The shutter controller 30 sets a shutter ON time according to brightness of the worktable surface with which the optical mouse comes into contact such that the movement calculator 20 can obtain a frame having an exact image of the worktable surface. And, when the shutter On time is reached according to the set shutter ON time, the shutter controller 30 generates a shutter ON control signal and transmits it to the image sensor 10. When a shutter OFF time is reached, the shutter controller 30 generates a shutter OFF control signal and transmits it to the image sensor 10.

Further, the shutter controller 30 provides information of the set shutter ON time to the light source controller 40.

The light source controller 40 sets a light source ON time so as to cause the shutter ON time to overlap the light source ON time and cause the light source ON time to be longer than the shutter ON time in response to the shutter ON time information transmitted from the shutter controller 30.

And, when the light source ON time is reached according to the set light source ON time, the light source controller 40 generates a light source ON control signal and transmits it to the light source 60. When a light source OFF time is reached, the light source controller 40 generates a light source OFF control signal and transmits it to the light source 60.

At this time, the light source ON period represented by the reference number (10) of FIG. 8 is always adapted to be longer relative to the shutter ON period represented by the reference number (20) of FIG. 8.

This is because, in view of the operational characteristic of the optical mouse, the light source 60 is always in the ON state when the image sensor 10 becomes the shutter ON state, in order for the image sensor to read an exact quantity of light.

Further, the light source controller 40 receives the movement value of the optical mouse outputted from the movement calculator 20, and generates the light source ON or OFF control signal for transmitting, to the outside, data corresponding to the movement value received from the movement calculator 20 for the shutter OFF period as in FIG. 10, and transmits the generated control signal to the light source 60.

Of course, the light source controller 40 can receive various kinds of data, such as button push information and mouse wheel information, transmitted from other devices (not shown), and then turns on/off the light source 60 to transmit the received data to the outside in the similar method to the above-mentioned one.

The light source 60 can be an infrared LED (Light Emitting Diode), which is turned on/off in response to the light source ON or OFF control signal transmitted from the light source controller 40.

Figure 13:
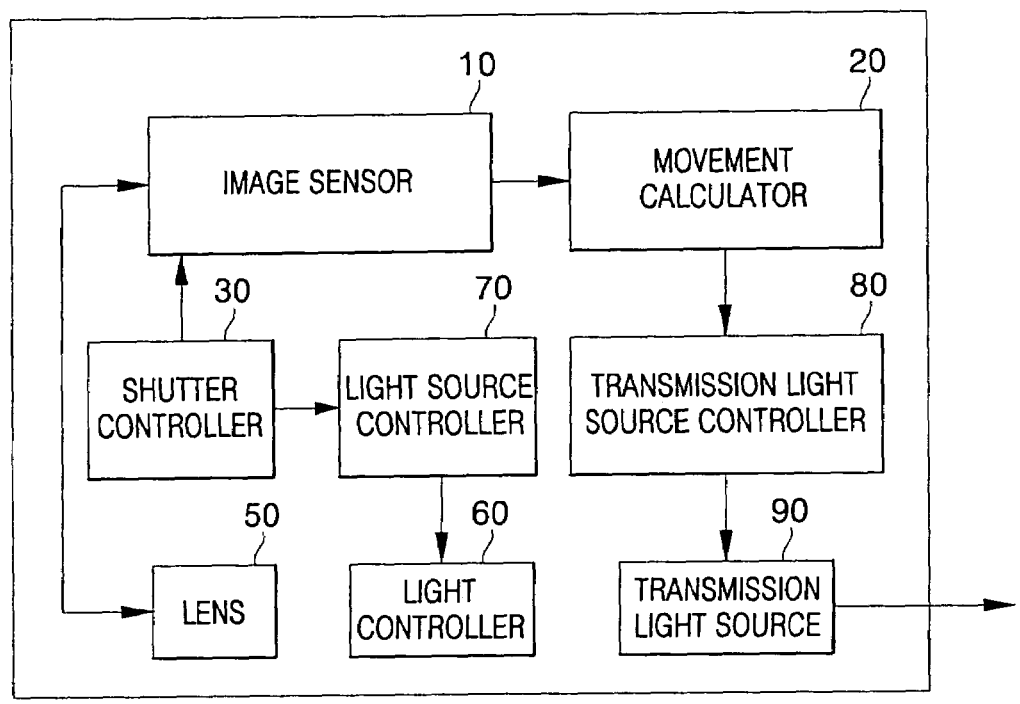
FIG. 13 shows a configuration of an optical mouse according to another embodiment of the present invention.

FIG. 13 shows a configuration of an optical mouse according to another embodiment of the present invention.

The optical mouse of FIG. 13 includes a separate transmitter for transmitting data when being compared with the optical mouse of FIG. 12.

To this end, the optical mouse of FIG. 13 includes an image sensor 10, a movement calculator 20, a shutter controller 30, a light source controller 70, a lens 50 and a light source 60 as in the optical mouse shown in FIG. 12, and further includes a transmission light source controller 80 and a transmission light source 90. Therefore, with regard to circuits providing the same structure and operation as those of FIG. 12, the same number as in FIG. 12 will be given, and their detailed descriptions will be omitted.

The light source controller 70 sets a light source ON time in response to shutter ON time information transmitted from the shutter controller 30, like the light source controller 40 of FIG. 8, generates a light source ON or OFF control signal for allowing the light source 60 to be turned on/off according to the set light source ON time, and transmits the generated control signal to the light source 60.

The transmission light source controller 80 receives a movement value of the optical mouse outputted from the movement calculator 20, and generates the light source ON or OFF control signal for transmitting, to the outside, data corresponding to the movement value received from the movement calculator 20 for the shutter OFF period as in FIG. 10, and transmits the generated control signal to the light source 60.

The transmission light source 90 can be an infrared LED (Light Emitting Diode), which is turned on/off in response to the light source ON or OFF control signal transmitted from the transmission light source controller 80.

While the present invention has been described about the optical mouse by way of one example of the optical input device, it will be understood to those skilled in the art that the present invention is equally applied to any other optical input device s capable of collecting light from a light source, obtaining an image, calculating, and outputting the movement except for the above-mentioned optical mouse.

Therefore, the light source controlling method and the optical input device using the same in accordance with the present invention prevents undesired consumption of the electric power of the light source to increase energy efficiency by actively setting the ON time of the light source having the maximum consumption of the electric current according to the shutter ON time.

Further, the light source controlling method and the optical input device using the same in accordance with the present invention increases availability of the light source and its electric current by controlling the light source for the shutter OFF period and by allowing the light source to be used as a source for the data transmission.

What is claimed is:

1. A method for controlling a light source in an optical input device for controlling an indicating position on a graphic display, comprising:
    setting a shutter ON time of an image sensor using a statistical value of an image obtained through the image sensor;
    setting a light source ON time in accordance with the shutter ON time and turning on/off the light source in response to the set light source ON time and turning on/off the shutter in response to the set shutter ON time and setting a light source ON period to be relatively longer than a shutter ON period; and
    when the image sensor becomes a shutter OFF state and data to be transmitted are present, controlling the light source to transmit the data from the optical input device to outside,
    wherein turning on/off the light source includes:
    turning on the light source first according to the light source ON time and then turning on the shutter according to the shutter ON time; and
    turning off the light source when the shutter is turned off, wherein setting the shutter ON time includes:
    calculating the statistical value of output signals of the image sensor, and comparing the calculated statistical value with a set statistical value.

2. The method as set forth in claim 1, wherein the statistical value is an average value of the image obtained through the image sensor, as a setting means.

3. The method as set forth in claim 2, wherein setting the shutter ON time includes:
    setting an average value of output signals of the image sensor requiring to obtain an exact image;
    calculating an average value of output signals of the image sensor outputting currently, and comparing the calculated average value with the set average value; and
    decreasing the shutter ON time when the calculated average value is greater than the set average value, and increasing the shutter ON time when the calculated average value is smaller than the set average value.

4. The method as set forth in claim 3, wherein the output signals are outputted from each of all the pixels within the image sensor.

5. The method as set forth in claim 3, wherein the output signals are outputted from a part of pixel array within the image sensor.

6. The method as set forth in claim 3, wherein the output signals are outputted from a designated pixel or designated pixels within the image sensor.

7. The method as set forth in claim 1, wherein the statistical value is the number having maximum and minimum values from among the statistical value of the image obtained through the mage sensor, as a means of setting the shutter ON time.

8. The method as set forth in claim 7, wherein setting the shutter ON time includes:
    setting maximum and minimum values of output signals of the image sensor requiring to obtain an exact image, a first allowable number of the output signals having a value greater than the maximum value, and a second allowable number of the output signals having a value smaller than the minimum value;

comparing the output signal of each pixel within the image sensor with the set maximum and minimum values, and calculating the first number of the output signals having the value greater than the maximum value and the second number of the output signals having the value smaller than the minimum value; and decreasing the shutter ON time when the calculated first number is greater than the first allowable number and the second number is greater than the second allowable number, or when the calculated first number is greater than the first allowable number and the second number is smaller than the second allowable number, and increasing the shutter ON time when the calculated first number is smaller than the first allowable number and the second number is greater than the second allowable number.

9. The method as set forth in claim 1, wherein the statistical value is the number of edges of the image obtained through the image sensor, as a means of setting the shutter ON time.

10. The method as set forth in claim 9, wherein setting the shutter ON time includes:

setting the number of edges of the image of the image sensor requiring to obtain an exact image;

calculating the edge number of the current image inputted through the image sensor, getting the calculated edge number on the accumulative average, and comparing the current accumulative average with a previous accumulative average;

as a result of the comparison, when the current accumulative average is greater than the previous accumulative average, reversing and controlling a state of controlling the current shutter ON time, and when the current accumulative average is smaller than the previous accumulative average, comparing the current accumulative average with the set edge number; and as a result of the comparison, when the current accumulative average is greater than the set edge number, maintaining the current shutter ON time, and when the current accumulative average is smaller than the set edge number, maintaining the state of controlling the current shutter ON time.

11. An optical input device using a method for controlling a light source, comprising:

an image sensor for collecting incident light when becoming a shutter ON state;

a movement calculator for calculating and outputting a value of movement using a quantity of the incident light collected on the image sensor;

a shutter controller for setting a shutter ON time according to brightness of a subject to be shot by the incident light and controlling the image sensor according to the set shutter ON time; and a light source controller for setting a light source ON time to correspond to the shutter ON time of the shutter controller, controlling the light source according to the set light source ON time and setting a light source ON period to be relatively longer than a shutter ON period, and when the image sensor becomes a shutter OFF state and the movement value of the optical input device is received from the movement calculator, controlling the light source to transmit the movement value from the optical input device to outside, wherein the light source ON time is set to turn on the light source before the shutter is ON and to turn off the light source when the shutter ON time is terminated.

12. The optical input device as set forth in claim 11, wherein the light source makes use of an infrared light emitting diode.

13. The optical input device as set forth in claim 11, wherein the shutter ON time is set using an average value of output signals of the image sensor.

14. The optical input device as set forth in claim 11, wherein the shutter ON time is set using maximum and minimum values of output signals of the image sensor.

15. The optical input device as set forth in claim 11, wherein the shutter ON time is set using the number of edges of an image obtained through the image sensor.

16. An optical input device using a method for controlling a light source, comprising:

an image sensor for collecting incident light when becoming a shutter ON state;

a movement calculator for calculating and outputting a value of movement using a quantity of the incident light collected on the image sensor;

a shutter controller for setting a shutter ON time according to brightness of a subject to be shot by the incident light and controlling the image sensor according to the set shutter ON time;

a light source controller for setting a light source ON time to correspond to the shutter ON time of the shutter controller and controlling the light source according to the set light source ON time and setting a light source ON period to be relatively longer than a shutter ON period;

a transmission light source controller for transmitting the movement value of the optical input device to outside when the image sensor becomes a shutter OFF state and the movement value is received from the movement calculator; and a transmission light source for performing self ON/OFF operation in response to a transmission light source control signal transmitted from the transmission light source controller, wherein the light source ON time is set to turn on the light source before the shutter is ON and to turn off the light source when the shutter ON time is terminated.

17. The optical input device as set forth in claim 16, wherein the shutter ON time is set using an average value of output signals of the image sensor.

18. The optical input device as set forth in claim 16, wherein the shutter ON time is set using maximum and minimum values of output signals of the image sensor.

19. The optical input device as set forth in claim 16, wherein the shutter ON time is set using the number of edges of an image obtained through the image sensor.

* * * * *